(12) United States Patent
Blaum

(10) Patent No.: US 7,127,660 B2
(45) Date of Patent: Oct. 24, 2006

(54) METHOD, APPARATUS AND PROGRAM STORAGE DEVICE FOR CORRECTING A BURST OF ERRORS TOGETHER WITH A RANDOM ERROR USING SHORTENED CYCLIC CODES

(75) Inventor: Mario Blaum, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 479 days.

(21) Appl. No.: 10/757,207

(22) Filed: Jan. 14, 2004

(65) Prior Publication Data

US 2005/0154966 A1 Jul. 14, 2005

(51) Int. Cl.
*H03M 13/17* (2006.01)
(52) U.S. Cl. .................. 714/761; 714/785
(58) Field of Classification Search .......... 714/759, 714/761, 781, 785
See application file for complete search history.

(56) References Cited

U.S. PATENT DOCUMENTS

| | | | |
|---|---|---|---|
| 3,831,143 A * | 8/1974 | Trafton ............... | 714/755 |
| 4,059,825 A * | 11/1977 | Greene ............... | 714/762 |
| 4,592,054 A | 5/1986 | Namekawa et al. | |
| 4,916,702 A * | 4/1990 | Berlekamp ............ | 714/762 |
| 5,377,208 A * | 12/1994 | Schneider-Obermann et al. ............... | 714/761 |
| 5,381,423 A * | 1/1995 | Turco ................ | 714/762 |
| 5,657,331 A * | 8/1997 | Metzner et al. ......... | 714/762 |
| 6,427,219 B1 | 7/2002 | Yang | |

OTHER PUBLICATIONS

Meggitt, J.E., "Error Correcting Codes for Correcting Bursts of Errors," *IBM JOURNAL*, Jul. 1960, pp. 329-334.
Chien, R.T. and Tang, D.T., "On Definitions of a Burst," *IBM JOURNAL*, Jul. 1965, pp. 292-293.
Wyner, Aaron D., "A Note on a Class of Binary Cyclic Codes Which Correct Solid-Burst Errors," *IBM JOURNAL*, Jan. 1964, pp. 68-69.
Gorog, E., "Some New Classes of Cyclic Codes Used for Burst-Error Correction," *IBM JOURNAL*, Apr. 1963, pp. 102-111.

* cited by examiner

*Primary Examiner*—Stephen M. Baker
(74) *Attorney, Agent, or Firm*—David W. Lynch; Chambliss, Bahner & Stophel P.C.

(57) ABSTRACT

A method, apparatus and program storage device for correcting a burst of errors together with a random error using cyclic or shortened cyclic codes is disclosed. The present invention solves the above-described problems by providing a received word to a syndrome register defined by a polynomial of degree n-k, said polynomial generating a cyclic or shortened cyclic code, wherein n is the length and k is the number of information bits in the codeword. The syndrome gets modified each time the received (possibly noisy) word is shifted. The contents of the syndrome register are processed to identify a random error together with an error burst of the received word. Then correction of the random error and the burst is made and a corrected codeword is generated.

30 Claims, 9 Drawing Sheets

600

| Generator Polynomial | Parameters |
|---|---|
| 100110101111 | [15, 4] |
| 1000101111011 | [17, 5] |
| 1101010001111 | [18, 6] |
| 10001001111001 | [20, 7] |
| 10001001111101 | [21, 8] |
| 10001001111101 | [22, 9] |
| 100001001111101 | [24, 10] |
| 100100010110011 | [25, 11] |
| 1000001001011011 | [27, 12] |
| 1000001100111101 | [28, 13] |
| 1000010010011101 | [29, 14] |
| 1000001111011101 | [30, 15] |
| 1001101110010101 | [31, 16] |
| 1100100110000111 | [32, 17] |
| 10000011101100011 | [34, 18] |
| 10000000101001011 | [35, 19] |
| 10000100011101111 | [36, 20] |
| 10000100111001011 | [37, 21] |
| 10010000011110011 | [38, 22] |
| 10101100001011101 | [39, 23] |
| 100000000100101101 | [41, 24] |
| 100000000111010101 | [42, 25] |
| 100000010101100011 | [43, 26] |
| 100000011001111101 | [44, 27] |
| 100000100001001111 | [45, 28] |
| 100000010010011101 | [46, 29] |
| 100000101110101001 | [47, 30] |
| 100100101111010011 | [48, 31] |
| 100100101111010011 | [49, 32] |
| 100100101111010011 | [51, 34] |
| 1000000111101001001 | [53, 35] |
| 1000100100100111001 | [54, 36] |
| 1000010001110111101 | [55, 37] |
| 1000000110000111101 | [56, 38] |
| 1000000011101110101 | [57, 39] |
| 1000001011001000011 | [58, 40] |

| Generator Polynomial | Parameters |
|---|---|
| 10000100110101110111 | [59, 41] |
| 10100100010111010101 | [60, 42] |
| 10000101011000010011 | [61, 43] |
| 10010101011101110111 | [62, 44] |
| 10000010110011000011 | [63, 45] |
| 100000000011011110011 | [65, 46] |
| 100000010111100001011 | [66, 47] |
| 100000100001101110111 | [67, 48] |
| 100000001011101111111 | [68, 49] |
| 100000010100010101001 | [69, 50] |
| 100001110000110001111 | [70, 51] |
| 100000100001111100001 | [71, 52] |
| 1000000100001110111111 | [72, 53] |
| 100000110101011100101 | [73, 54] |
| 100000110101011001101 | [74, 55] |
| 100100100101010100011 | [75, 56] |
| 100000000101110100101 | [76, 57] |
| 101010010010000111101 | [77, 58] |
| 101110001011111000011 | [78, 59] |
| 1000000001001101110001 | [80, 60] |
| 1000000010011101110001 | [81, 61] |
| 1000000000011111001101 | [82, 62] |
| 1000000100110000110011 | [83, 63] |
| 1000000010010000010111 | [84, 64] |
| 1000000010010000010111 | [85, 65] |
| 1000000000111100010101 | [86, 66] |
| 1000000000111110010101 | [87, 67] |
| 1000000000111100101001 | [88, 68] |
| 1000000111011001111101 | [89, 69] |
| 1000000111011001111101 | [90, 70] |
| 1000001101110100011101 | [91, 71] |
| 1000000010100111110001 | [92, 72] |
| 1000000010110001101101 | [93, 73] |
| 1000110010001010100111 | [94, 74] |
| 1000110010001010100111 | [95, 75] |
| 10001111110111000101 | [96, 76] |
| 10101001001110110111 | [97, 77] |

700

| Generator Polynomial | Parameters |
|---|---|
| 1000000001011010100011 | [99, 78] |
| 1000000000101010111001 | [100, 79] |
| 1000000000101010111001 | [101, 80] |
| 1000000000110101000011 | [102, 81] |
| 1000000000100010001001 | [103, 82] |
| 1000000001011010100011 | [104, 83] |
| 1000000001101111100001 | [105, 84] |
| 1000000000110111100001 | [106, 85] |
| 1000000001111100100111 | [107, 86] |
| 1000000011101000111011 | [108, 87] |
| 1000000100010111101011 | [109, 88] |
| 1000000111010011000011 | [110, 89] |
| 1000000100001111001111 | [111, 90] |
| 1000000011011011110111 | [112, 91] |
| 1000001001101110001001 | [113, 92] |
| 1000000010100010010011 | [114, 93] |
| 1000100111101110001111 | [115, 94] |
| 1001011100111110000111 | [116, 95] |
| 1000011010010010110011 | [117, 96] |
| 1000110011000000000101 | [118, 97] |
| 1001001100010000110011 | [119, 98] |
| 1001011101001110101101 | [120, 99] |
| 1000111011101110100011 | [121, 100] |

Fig. 7

METHOD, APPARATUS AND PROGRAM STORAGE DEVICE FOR CORRECTING A BURST OF ERRORS TOGETHER WITH A RANDOM ERROR USING SHORTENED CYCLIC CODES

BACKGROUND OF THE INVENTION

1. Field of the Invention

This invention relates in general to error correction codes, and more particularly to a method, apparatus and program storage device for correcting a burst of errors together with a random error using cyclic or shortened cyclic codes.

2. Description of Related Art

In current magnetic recording systems, read and write operations are made with respect to addressable ECC-coded sectors of tracks stored eventually on high-density direct access storage devices (DASD). DASDs or disk drives include at least one rotating disk covered with a magnetic coating that can store magnetic or electronic data and an apparatus for reading data from and writing data to that disk. This is implemented by a "spindle motor" to rotate the disk or disks, at least one "read/write head" to read and write data to and from the disk or disks, an "actuator" to position the read/write head or heads radially over the disk or disks either on a linear or rotary basis, and a "data channel" to transfer information between the read/write head or heads and an accessing source.

Information is recorded on the disk along concentric tracks divided into sectors. Years ago, all the tracks had the same number of bytes recorded thereon. This meant that the recording density per track varied inversely with radial distance. Today, the recording practice and the capacity have changed such that groups of concentric tracks form a zone and have data recorded at a density (bytes/track inch) that is constant. Thus, the tracks in the outer zones will have more information recorded thereon than those on the inner zones.

The sectors on each track are each operable on a unit of addressable storage. Generally in the industry, each addressable sector consists of 512 bytes. Each sector includes redundant bytes that aid in the detection and correction of errors up to some fixed limit. Whenever an error or erasure exceeds the capacity of the sector level code, then additional measures are needed to recover.

It is also desirable to superimpose additional associations among the units of storage, either to assist in rapid accessing or to enhance the active or passive protection of the data. These additional associations are termed collectively as "logical views" of storage. One construct can be formed from a logical association of an arbitrary set of n same-size storage units and a redundancy unit derived therefrom. In the case of error or erasure beyond the ECC capacity for that sector, data on that sector would be unavailable. However, it can be reconstructed by logically combining the remaining n-1 sectors with the redundant sector of that group.

Block or cyclic codes have long been used for detecting and correcting multiple bits or bytes in error in long bit or byte strings read back from a cyclic, concentric, tracked storage medium such as a magnetic disk storage subsystem or the like. Typically, each bit or byte string of predetermined length is treated as if it were an algebraic polynomial and subject to modulo division by an encoding polynomial. If the code is denominated as being "systematic", then redundant bits or bytes derived from the data are appended to the data string which otherwise remains intact.

In the case of linear block cyclic or shortened cyclic codes, the remainder is generally appended to the end of the data bit or byte string, although in certain implementations it may be convenient to append it at the beginning instead. Each data bit or byte string plus the appended remainder is then recorded on a storage medium or transmitted. Subsequently, when the data is accessed and played back from the medium, a remainder is in principle recalculated from the datastream as it is extracted and compared with the recorded remainder. If the remainder values comparison match, the difference result is zero. If the results do not match (nonzero difference), then this is indicative of error. Codes are now quite advanced such that the remainders are processed not only for identifying the presence of errors, but also for pinpointing its location and determining the correction values to be applied to the datastream. This is referred to as syndrome processing. Codes used for error correction are called error-correcting codes (ECC).

A code, C, is said to be a linear cyclic code if the cyclic shift of each codeword is also a codeword. If each codeword u in C is of length n, then the cyclic shift $\pi(u)$ of u is the word of length n obtained from u by shifting the last digit of u and moving it to the beginning, all other digits moving one position to the right. Reed-Solomon (RS) codes are the main example of linear cyclic ECC codes based on bytes. They are used extensively in magnetic recording and communications. One advantage of RS codes is that they maintain maximum distance among codewords for any given length of data. This "spacing" between permissible codewords renders them useful for detecting and correcting randomly occurring byte errors as well as burst errors over a run of contiguous bytes.

When the data is read from any storage system, the data bytes are subject to error and erasure from random, intermittent, and recurrent sources. These may be due to media defects, signal coupling between tracks, extraneous signals induced in the readback path, etc. It is generally desired to correct the errors in place. This means that an array is read from the medium and written into a sufficiently sized buffer or RAM and memory local to the storage subsystem.

Error correcting codes have thus been used to correct such errors. However, correcting bursts of errors is a difficult problem. Even for correction of one burst, the best codes are found by extensive computer search, although there are analytical constructions like Fire codes. A Fire code is a conventional linear binary block code, i.e., it consists in transmitting, in addition to k information bits, a number or redundant bits computed by exclusive-or manipulations on the information bits. For example, the original k information bits can be used to build a polynomial, whose coefficients are the bits of the sequence. The redundancy can be expressed as the coefficients of another polynomial obtained as the remainder of the division of the polynomial representing the sequence by a pre-defined polynomial, characteristic of the code and called the generator polynomial. Thus, a Fire code has a generator polynomial designed to allow good detecting and/or correcting performance when errors happen in bursts.

Nevertheless, correcting just one burst may be a problem when an extra random error occurs in addition to a burst. Data error in the storage context means any change in the stored value as a consequence of either random noise or a burst. In systems storing binary values such as 1 1 1 0 0 1 0 0, remanent magnetization states change such that some 1's become 0's and some 0's become 1's. This might appear as 1 1 0 0 0 1 0 0. Here, the value in the 3rd position from the left is a random error. A run of errors due to a burst source may cause the string to appear as 1 1 1 1 1 1 1 0. Here, positions 4, 5 and 7 are actually in error. Although position 6 is not in error, this is considered to be a burst of length four.

This means, the first and last bits of the burst determine its length, the inner bits may be in error or not.

The presence of a single random error along with a burst of errors may result in incorrect decoding when using conventional burst-correcting codes, like Fire codes. The traditional solution of interleaving Reed-Solomon (RS) codes may be too expensive for channels requiring correction of one burst together with a random error.

It can be seen then that there is a need for a method, apparatus and program storage device for correcting a burst of errors together with a random error using cyclic or shortened cyclic codes.

SUMMARY OF THE INVENTION

To overcome the limitations in the prior art described above, and to overcome other limitations that will become apparent upon reading and understanding the present specification, the present invention discloses a method, apparatus and program storage device for correcting a burst of errors together with a random error using cyclic or shortened cyclic codes.

The present invention solves the above-described problems by providing a received word to a syndrome register defined by a polynomial of degree n-k, said polynomial generating a cyclic or shortened cyclic code, wherein n is the length and k is the number of information bits in the codeword (k is generally referred as the dimension of the code). The syndrome gets modified each time the received (possibly noisy) word is shifted. The contents of the syndrome register are processed to identify a random error together with an error burst of the received word. Then correction of the random error and the burst is made and a corrected codeword is generated, which is the corrected version of the received word.

A method in accordance with the principles of the present invention includes providing a received word in a syndrome register for analysis, the syndrome register being defined by a polynomial of degree n-k generating a cyclic code of length n and dimension k, k being the number of information bits in each codeword of said code, the received word being shifted in a first direction in the syndrome register M times, wherein M is less than or equal to n, analyzing the syndrome register to determine whether the first n-k-b bits in the syndrome register are zero, when a bit in the first n-k-b bits in the syndrome register is determined to be non-zero, XORing the vector in the syndrome register with all possible syndromes corresponding to one error, and identifying a random error and an error burst in the last b bits of the syndrome register when an XOR of the first n-k-b bits in the syndrome register results in the first n-k-b bits equaling zero.

In another embodiment of the present invention, an apparatus for correcting a burst of errors having a length b together with a random error is provided. The apparatus includes a trap decoder comprising a syndrome register and a buffer register, the syndrome register defined by a polynomial of degree n-k generating a cyclic code of length n and dimension k, k being the number of information bits in each codeword of said code, the received word being shifted in a first direction in the syndrome register M times, wherein M is less than or equal to n and a module, coupled to the syndrome register, for determining, for each shift of the received word, whether a bit in the first n-k-b bits in the syndrome register is non-zero, XORing a vector in the syndrome register with all possible syndromes corresponding to one error and identifying a random error and an error burst in the last b bits of the syndrome register when an XOR of the first n-k-b bits in the syndrome register results in the first n-k-b bits equaling zero.

In another embodiment of the present invention, another apparatus for correcting a burst of errors having a length b together with a random error is provided. This apparatus includes memory for receiving a word representing bits of received data and a processor, coupled to the memory, the processor being configured for calculating an n-k bit syndrome for each shift of the received word defined by a polynomial of degree n-k generating a cyclic code of length n and dimension k, k being the number of information bits in each codeword of said code, the received word being shifted in a first direction in the syndrome register M times, wherein M is less than or equal to n, the processor determining, for each shift of the received word, whether a bit in the first n-k-b bits in the syndrome register is non-zero, XORing a vector in the syndrome register with all possible syndromes corresponding to one error and identifying a random error and an error burst in the last b bits of the syndrome register when an XOR of the first n-k-b bits in the syndrome register results in the first n-k-b bits equaling zero.

In another embodiment of the present invention, a storage system is provided. The storage system includes at least one magnetic recording medium for recording data thereon, at least one transducer, associated with each of the at least one magnetic recording medium, for reading and writing data on the magnetic recording medium, a motor, coupled to the at least one magnetic recording medium, for translating the magnetic recording medium, an actuator, coupled to the transducer, for translating the at least one transducer relative to the at least one magnetic recording medium and a storage device signal processor, coupled to the motor, transducer and actuator, for controlling the operation of the motor and actuator and for correcting a burst of errors having a length b together with a random error in a word received from the transducer, the storage device signal processor being configured for calculating an n-k bit syndrome for each shift of the received word defined by a polynomial of degree n-k generating a cyclic code of length n and dimension k, k being the number of information bits in each codeword of said code, the received word being shifted in a first direction in the syndrome register M times, wherein M is less than or equal to n, the processor determining, for each shift of the received word, whether a bit in the first n-k-b bits in the syndrome register is non-zero, XORing a vector in the syndrome register with all possible syndromes corresponding to one error and identifying a random error and an error burst in the last b bits of the syndrome register when an XOR of the first n-k-b bits in the syndrome register results in the first n-k-b bits equaling zero.

In another embodiment of the present invention, a program storage device readable by a computer and tangibly embodying one or more programs of instructions executable by the computer to perform a method for correcting a burst of errors together with a random error using shortened cyclic codes is provided. The method includes providing a received word in a syndrome register for analysis, the syndrome register being defined by a polynomial of degree n-k generating a cyclic or shortened cyclic code of length n and dimension k, k being the number of information bits in each codeword of said code, the received word being shifted in a first direction in the syndrome register M times, wherein M is less than or equal to n, analyzing the syndrome register to determine whether the first n-k-b bits in the syndrome register are zero, when a bit in the first n-k-b bits in the syndrome register is determined to be non-zero, XORing the vector in the syndrome register with all possible syndromes corresponding to one error, identifying a random error and an error burst in the last b bits of the syndrome register when an XOR of the first n-k-b bits in the syndrome register results in the first n-k-b bits equaling zero.

In another embodiment of the present invention, another apparatus for correcting a burst of errors having length at most b together with a random error is provided. This apparatus includes means for receiving a word representing bits of received data, means, coupled to the memory, for calculating an n-k bit syndrome for each shift of the received word defined by a polynomial of degree n-k generating a cyclic code of length n and dimension k, k being the number of information bits in each codeword of said code, the received word being shifted in a first direction in the syndrome register M times, wherein M is less than or equal to n, means for determining for each shift of the received word, whether a bit in the first n-k-b bits in the syndrome register is non-zero, means for XORing a vector in the syndrome register with all possible syndromes corresponding to one error and means for identifying a random error and an error burst in the last b bits of the syndrome register when an XOR of the first n-k-b bits in the syndrome register results in the first n-k-b bits equaling zero.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 7 illustrates another table of generator polynomials of shortened cyclic codes for correcting a burst of length 3 together with a random error according to an embodiment of the present invention;

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method, apparatus and program storage device for correcting a burst of errors together with a random error using cyclic or shortened cyclic codes. A received possibly noisy word is provided to a syndrome register defined by a polynomial of degree n-k, said polynomial generating a cyclic or shortened cyclic code, wherein n is the length of the code and k it dimension, i.e., the number of information bits in a codeword. If the syndrome of the received word is zero, then it is determined that the received word corresponds to a codeword in the code, and the decoder decides that the received word contains no errors. Otherwise, if at least one bit in the syndrome is not zero, this means that errors have occurred and the decoder initiates corrective action. For each shift of the received word, a syndrome is estimated starting with the current received word, i.e., the zero shifts. The shifts can be either left shifts or right shifts, but they have to be consistent throughout the process. A determination is made whether the first n-k-b bits in the syndrome register are zero. If this is the case, then it is determined that a burst (given by the last b bits in the syndrome register) has occurred in the last b bits of the current shifted word. Those b bits are then corrected and the corrected shift is then shifted in the opposite direction the corresponding number of shifts to give a corrected version of the received word. When at least a bit in the first n-k-b bits in the syndrome register corresponding to the current shift is determined to be non-zero, the vector in the syndrome register is XORed with all possible syndromes corresponding to one error (which may be pre stored, for instance) until the first n-k-b bits are zero to identify a random error together with a burst in the last b bits of the current shift. If this is the case, correction of the burst as well as the random error is made in the current shift, the corrected shift is shifted back in the opposite direction and this shifted back codeword is the corrected version of the received word. If no solution is found after XORing the vector stored in the syndrome register with the syndromes corresponding to one error, the decoder proceeds with the next shift and repeats the process. If after n shifts no correction is made, the decoder declares an uncorrectable error.

Figure 1:
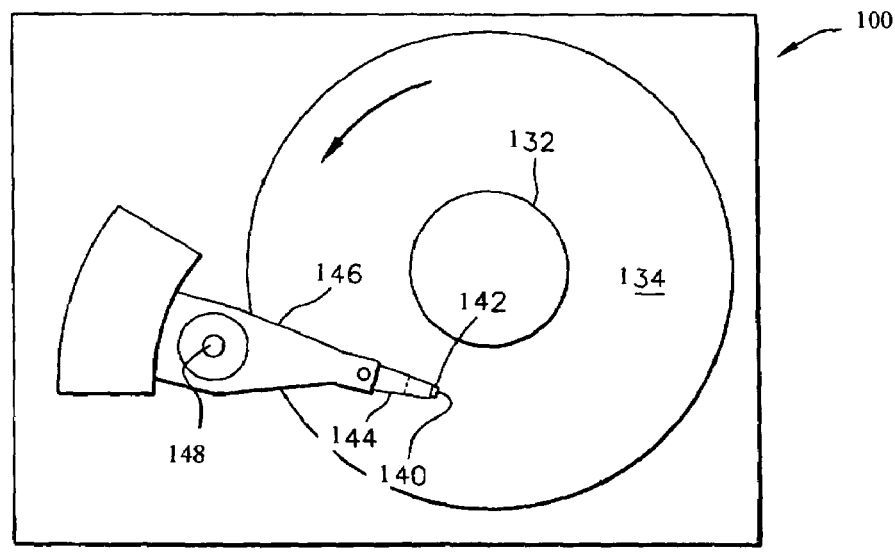
FIG. 1 illustrates a storage system according to the present invention.

FIG. 1 illustrates a storage system 100 according to the present invention. In FIG. 1, a transducer 140 is under control of an actuator 148. The actuator 148 controls the position of the transducer 140. The transducer 140 writes and reads data on magnetic media 134 rotated by a spindle 132. A transducer 140 is mounted on a slider 142 that is supported by a suspension 144 and actuator arm 146. The suspension 144 and actuator arm 146 positions the slider 142 so that the magnetic head 140 is in a transducing relationship with a surface of the magnetic disk 134.

Figure 2:
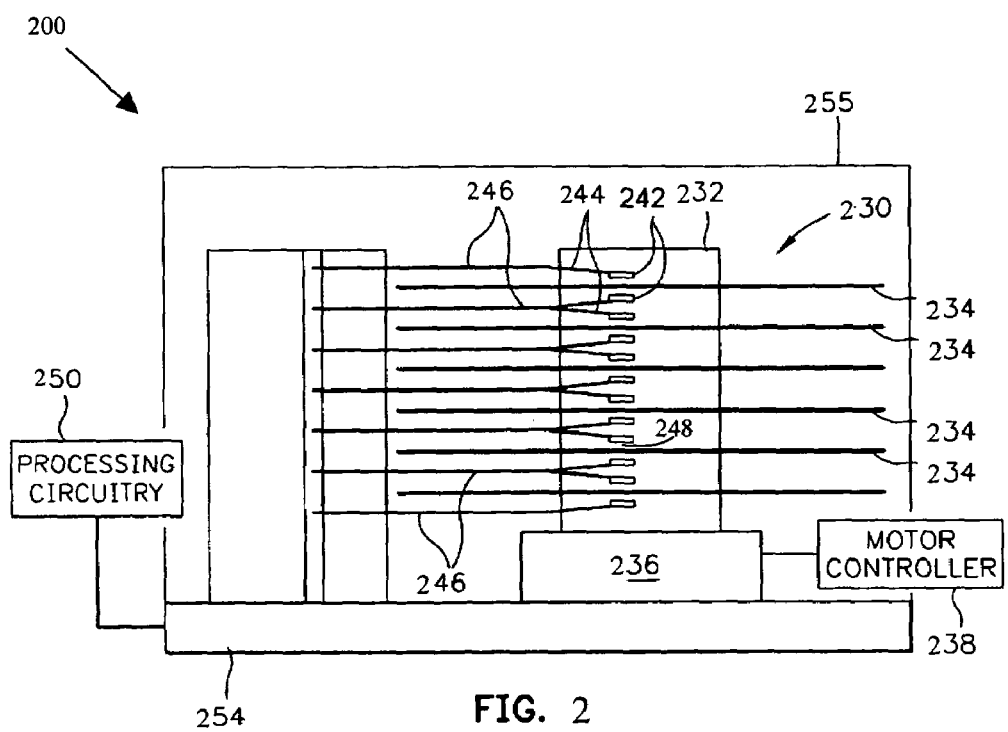
FIG. 2 illustrates one particular embodiment of a storage system according to the present invention.

FIG. 2 illustrates one particular embodiment of a storage system 200 according to the present invention. In FIG. 2, a hard disk drive 230 is shown. The drive 230 includes a spindle 232 that supports and rotates magnetic disks 234. A motor 236, mounted on a frame 254 in a housing 255, which is controlled by a motor controller 238, rotates the spindle 232. A combined read and write magnetic head is mounted on a slider 242 that is supported by a suspension 244 and actuator arm 246. Processing circuitry 250 exchanges signals, representing such information, with the head, provides motor drive signals for rotating the magnetic disks 234, and provides control signals for moving the slider to various tracks. The plurality of disks 234, sliders 242 and suspensions 244 may be employed in a large capacity direct access storage device (DASD).

When the motor 236 rotates the disks 234 the slider 242 is supported on a thin cushion of air (air bearing) between the surface of the disk 234 and the air bearing surface (ABS) 248. The magnetic head may then be employed for writing information to multiple circular tracks on the surface of the disk 234, as well as for reading information therefrom.

Figure 3:
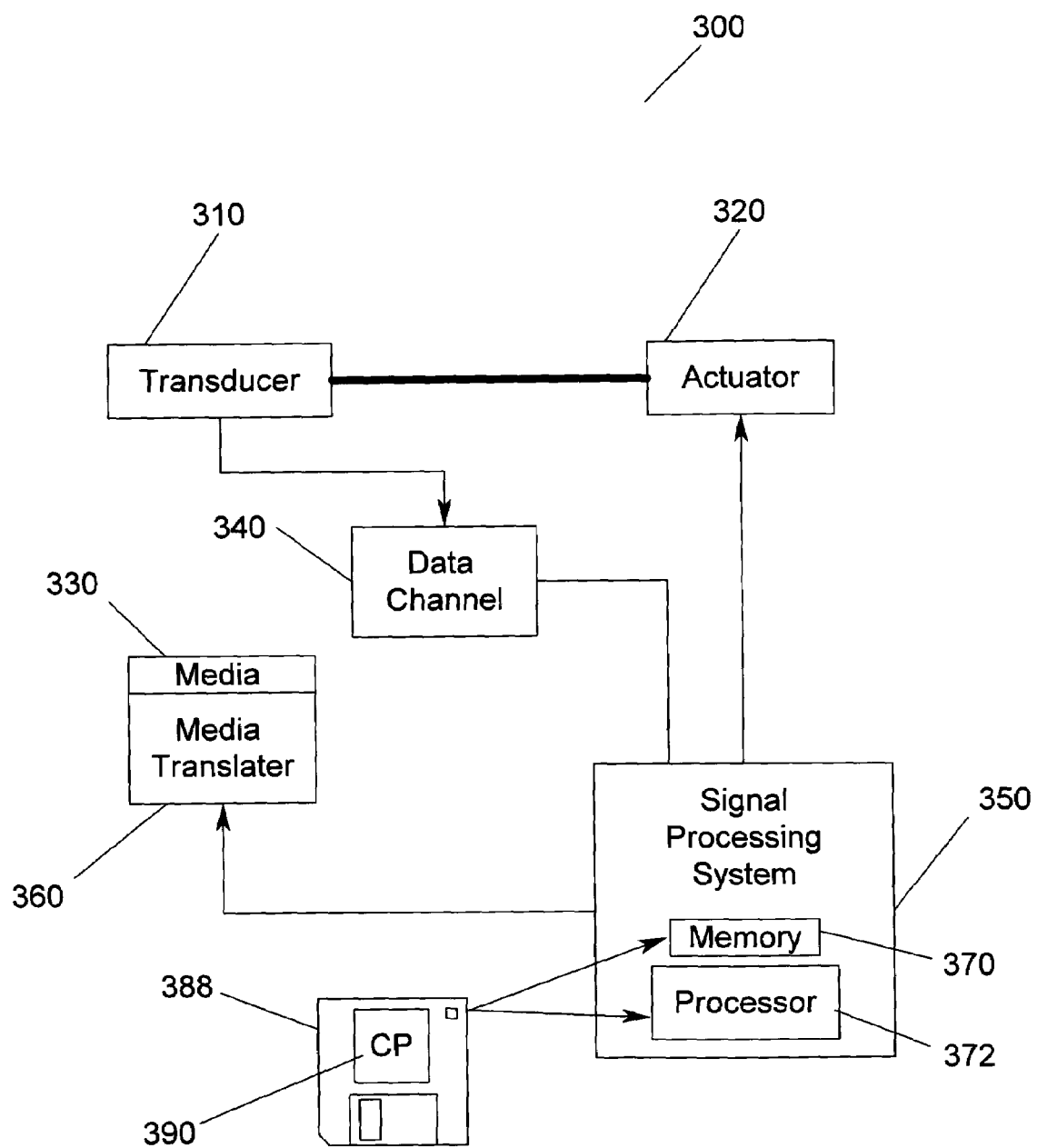
FIG. 3 illustrates a storage system according to the present invention.

FIG. 3 illustrates a storage system 300. In FIG. 3, a transducer 310 is under control of an actuator 320. The actuator 320 controls the position of the transducer 310. The transducer 310 writes and reads data on magnetic media 330. The read/write signals are passed to a data channel 340. A signal processor system 350 controls the actuator 320 and processes the signals of the data channel 340. In addition, a media translator 360 is controlled by the signal processor system 350 to cause the magnetic media 330 to move relative to the transducer 310. Nevertheless, the present invention is not meant to be limited to a particular type of storage system 300 or to the type of media 330 used in the storage system 300.

Figure 4:
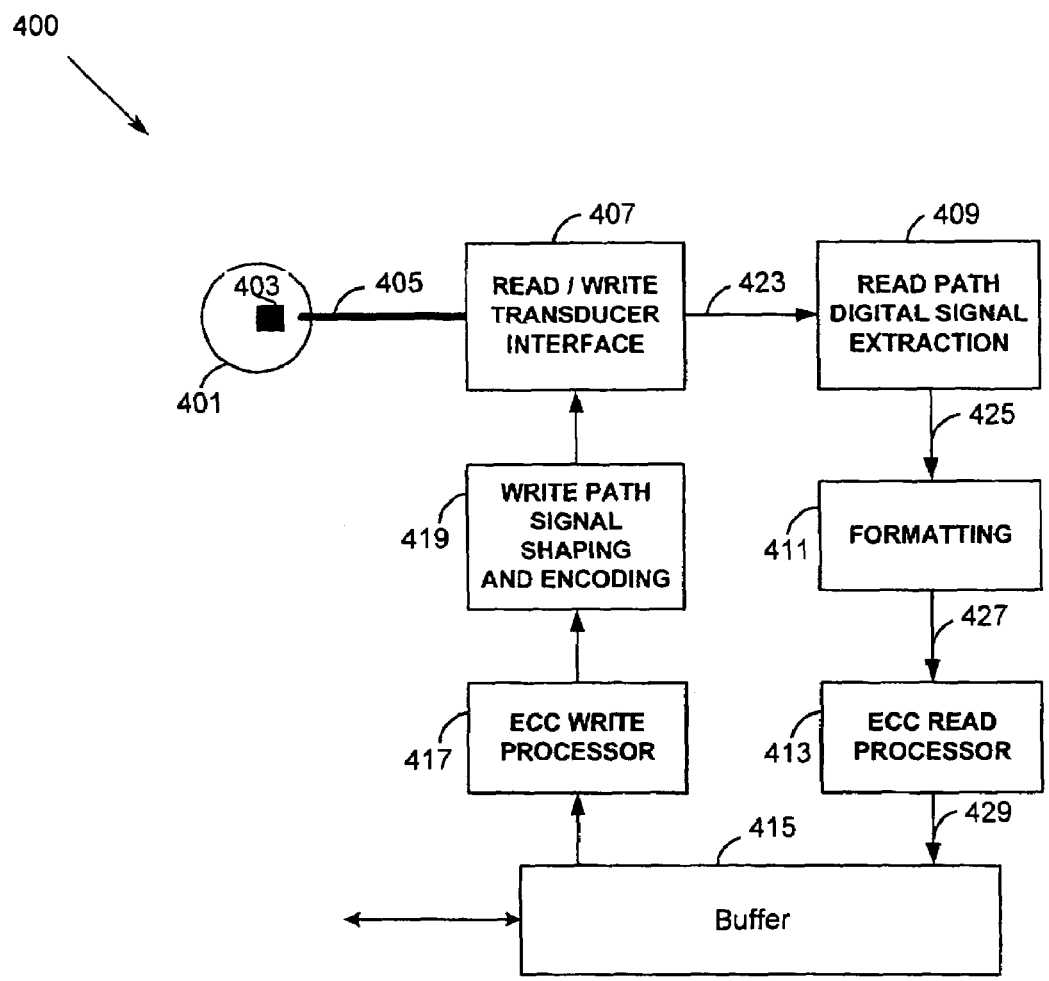
FIG. 4 is a partial logical view of a disk drive and a portion of the read and write paths according to an embodiment of the present invention.

FIG. 4 is a partial logical view 400 of a disk drive and a portion of the read and write paths according to an embodiment of the present invention. A disk drive includes a cyclically rotated magnetic disk 401 and a radial or axially movable access arm 405 tipped with an electromagnetic transducer 403. The transducer 403 is provided for either recording magnetic flux patterns representing sequences of digital binary codewords along any one of a predetermined number of concentric tracks on the disk, or reading the recorded flux patterns from a selected one of the tracks and converting them into codewords.

When sequences of digital binary data are to be written out to the disk 401, they may be placed temporarily in a buffer 415 and subsequently processed and transduced along a write path or channel 417, 419, 407, 405, 403 having several stages. First, a predetermined number of binary data elements are moved from the buffer and streamed through the ECC write processor 417 where they are mapped into codewords drawn from a suitable linear cyclic code. Next, each codeword is mapped in the write path signal-shaping unit 419. The output of the shaping unit is applied through an interface 407 and thence to the write element in a magnetoresistive or other suitable transducer 403 for conversion into magnetic flux patterns. All of the measures starting from the movement of the binary data elements from buffer 415 until the magnetic flux patterns are written on a selected disk track as the rotating disk 401 passes under the head 403 are synchronous and streamed. For purposes of efficient data transfer, the data is destaged (written out) or staged (read) a disk track at a time. Typical units of recording track length are equal fixed-length byte sectors of 256 bits or bytes, etc.

When sequences of magnetic flux patterns are to be read from the disk 401, they are processed in a separate so-called read path or channel 407, 409, 411, 413 and written into buffer 415. The time-varying signals sensed by transducer 403 are passed through the interface 407 to a signal extraction unit 409. Here, the signal is detected and a decision is made as to whether it should be resolved as a binary 1 or 0. As these 1's and 0's stream out of the signal extraction unit 409, they are arranged into codewords in the formatting unit 411. Since the read path is evaluating sequences of codewords previously recorded on disk 401, then absent error or erasure, the codewords should be the same. In order to test whether that is the case, each codeword is applied to the ECC read processor 413 over a path 427 from the formatter. Also, the sanitized output from the ECC processor 413 is written into buffer 415 over path 429. The read path must also operate in a synchronous data streaming manner such that any detected errors must be located and corrected within the codeword well in time for the ECC read processor 413 to receive the next codeword read from the disk track.

For a linear code C, if all burst errors of length b or less occur in distinct cosets of a standard array for C, then each can be uniquely identified by its syndrome, and all such errors are then correctable. Furthermore, if C is a linear code capable of correcting all burst errors of length b or less, then all such errors must occur in distinct cosets. A cyclic code can correct all burst errors of length b or less if and only if the syndrome polynomials for these bursts are distinct. Cyclic burst error correcting codes may be decoded by error trapping.

Figure 5:
FIG. 5 illustrates a table of generator polynomials of shortened cyclic codes for correcting a burst of length 2 together with a random error according to an embodiment of the present invention.
Figure 6:
FIG. 6 illustrates a table of generator polynomials of shortened cyclic codes for correcting a burst of length 3 together with a random error according to an embodiment of the present invention.

FIG. 5 illustrates a table 500 of generator polynomials of shortened cyclic codes for correcting a burst of length 2 together with a random error according to an embodiment of the present invention. FIG. 6 illustrates a table 600 of generator polynomials of shortened cyclic codes for correcting a burst of length 3 together with a random error according to an embodiment of the present invention. FIG. 7 illustrates another table 700 of generator polynomials of shortened cyclic codes for correcting a burst of length 3 together with a random error according to an embodiment of the present invention. By ensuring the syndromes of bursts of a certain length together with a random error are all distinct, the tables 500, 600, 700 provide polynomials for generating shortened cyclic codes capable of correcting a burst of length up to two or a burst of length up to three together with a random error for a variety of parameters [n, k], where n is the length and k the number of information bits, i.e., the dimension. The codes are optimal in the sense that there is no shortened cyclic code with the same number k of information bits, such that it can correct a burst of the same length together with a random error and such that its length is shorter than the one given in the tables. The results may be extended to codes that can correct one burst and detect a burst together with a random error. Nevertheless, the codes shown in tables 500, 600, 700 can also correct all-around bursts, although tables of codes without this characteristic could be presented, i.e., correctable bursts are not necessarily all-around. Decoding is performed by using a variation of the burst-trapping algorithm. Those skilled in the art will recognize that the present invention is not meant to be limited to the codes of table 500, 600, 700, but rather the codes of the tables 500, 600, 700 are presented for illustration purpose only. Generator polynomials for other parameters may be developed in accordance with the concepts provided by the present invention as well.

Figure 8:
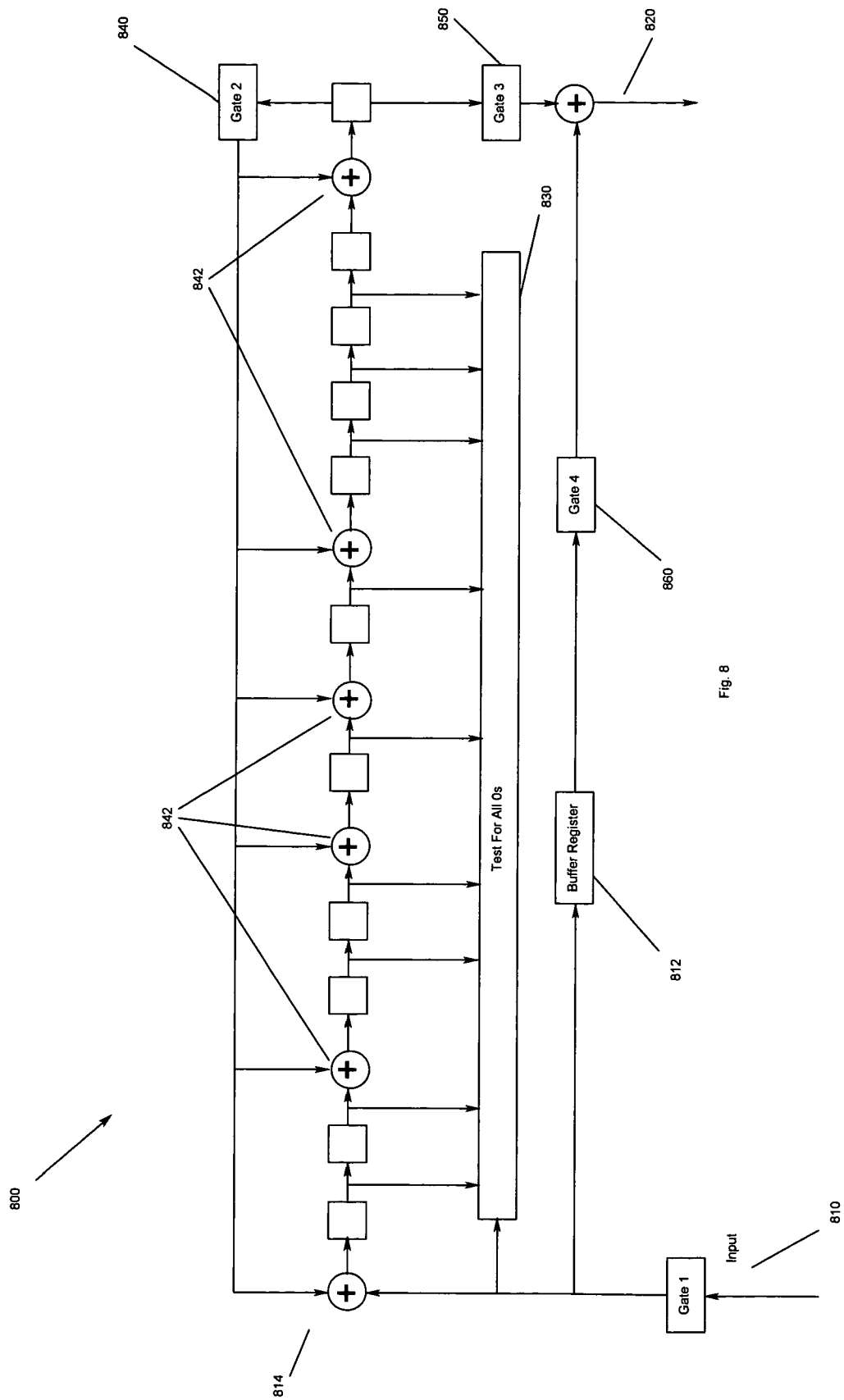
FIG. 8 is a block diagram of an error trapping decoder for the codes of FIGS. 5–7 according to an embodiment of the present invention.

FIG. 8 is a block diagram of an error trapping decoder 800 for the codes of FIGS. 5–7 according to an embodiment of the present invention. In FIG. 8, the received codeword 810 is shifted into the buffer register 812 and the shift register 814. At the same time, the previously corrected codeword is shifted out to the user 820. The shift register 814 tests the codeword for all zeroes 830, i.e., a syndrome is computed for identifying which bits are in error. The contents of the buffer register 812 and the shift register 814 are shifted to the right once each step. The output of the syndrome shift register 814 is provided to gate 2 840 wherein it is XORed with the input codeword 810 and with the output of delays 842. The output of the syndrome shift register 810 is also provided to gate 3 850. The output of gate 3 850 is XORed with the output from gate 4 860. This continues until the block of n digits is shifted through the registers 814.

For example, the [23, 12] code in the table 500 of FIG. 5 is generated by the polynomial:

$$g(x)=1+x^2+x^4+x^5++x^6+x^{10}+x^{11}.$$

The [23, 12] code in the table 500 of FIG. 5 may be used to trap bursts of length up to two. This code corresponds to the Golay code, so it can in fact correct up to three random errors. However, the codes in table 500 are provided for illustration of only one embodiment of the present invention. Nevertheless, to correct a random error in addition to a burst, an additional procedure is needed.

Figure 9:
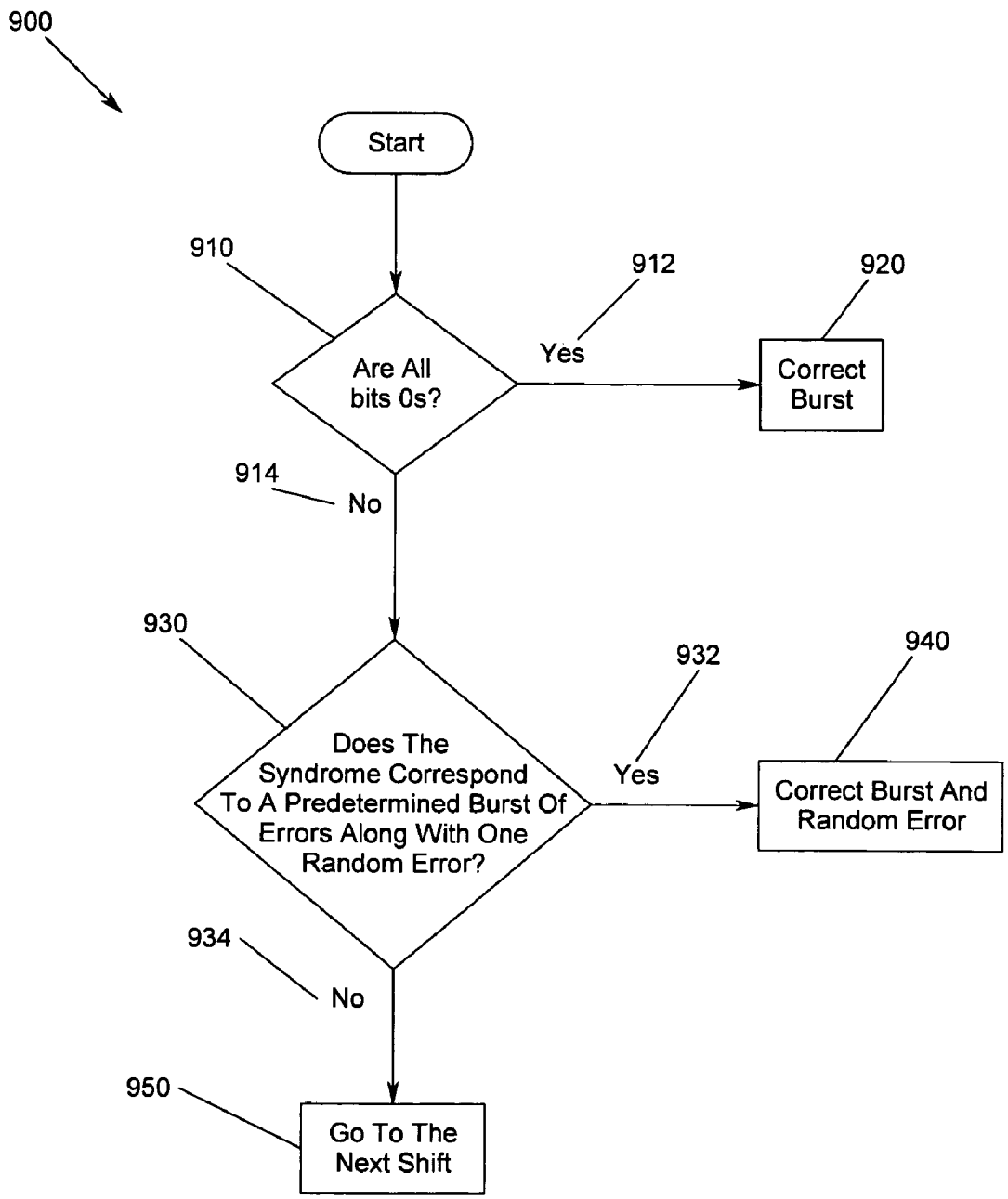
FIG. 9 is a flow chart of operations needed to correct a random error in addition to a burst according to an embodiment of the present invention.

FIG. 9 is a flow chart 900 of operations needed to correct a random error in addition to a burst according to an embodiment of the present invention. Considering as an example the [23, 12] code in the table 500 of FIG. 5 and referring to both FIGS. 8 and 9, for each shift of the decoder 800 in FIG. 8, the shift register 814 contains the 11-bit syndrome. A determination is made 830 whether the first 9 bits of the syndrome are zero 910. If the first 9 bits of the syndrome are zero 912, then the error pattern (i.e., a burst of length up to two) has been found and correction is implemented 920 according to the decoder 800 of FIG. 8. However, if at least one of the first 9 bits of the syndrome is non-zero 914, then a determination is made whether the syndrome corresponds to a predetermined burst of errors, i.e., in this case a burst of 2 errors, along with one random error 930. If the syndrome corresponds to a predetermined burst of errors along with one random error 932, the burst and random error are corrected 940. If not 934, then the next shift in the decoder 800 of FIG. 8 is performed 950. The above description may be generalized by referring to the cyclic code as having a length n and dimension k, k being the number of information bits in each codeword of said code, and by referring to the burst of errors as having a length of b bits.

Figure 10:
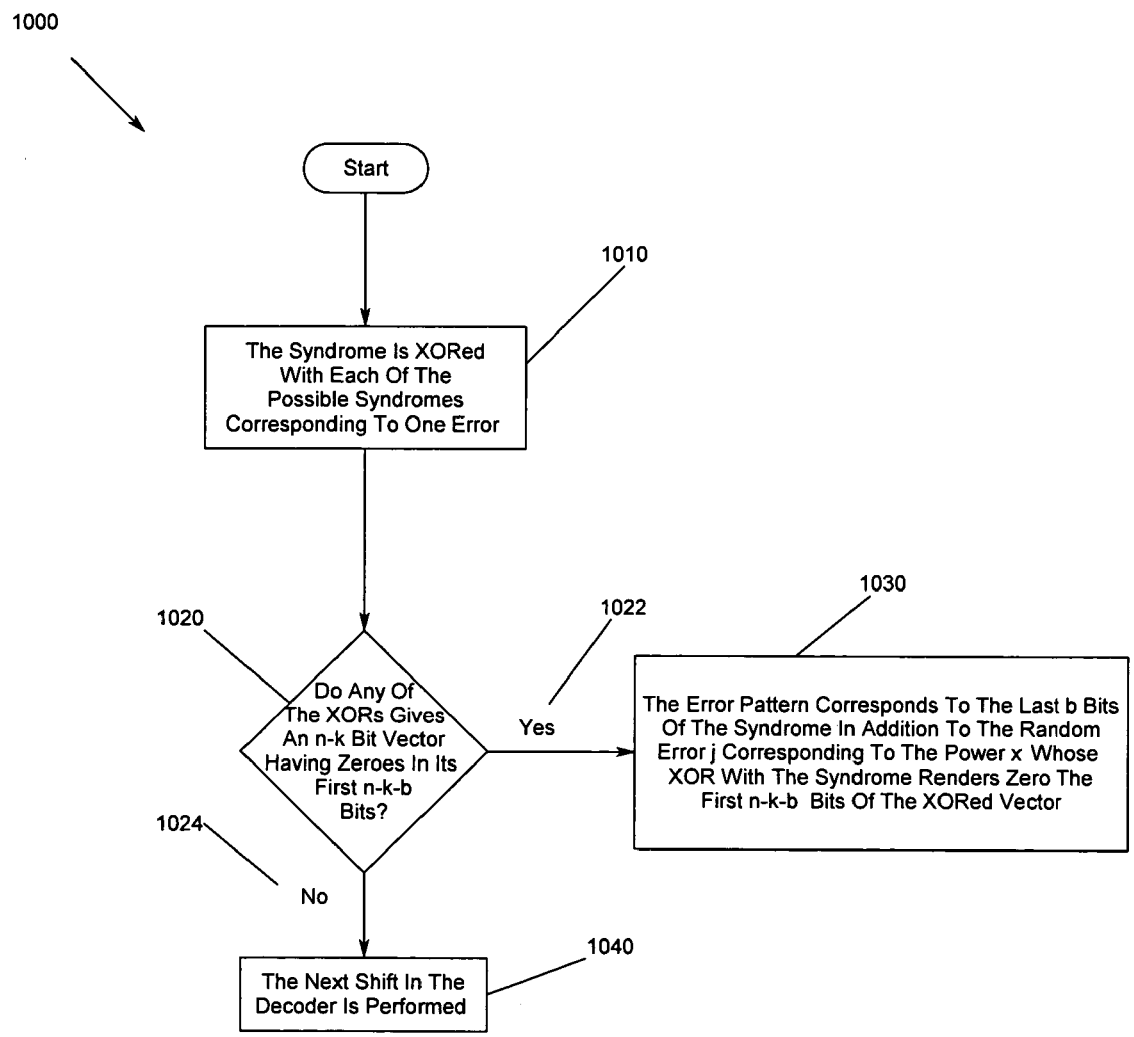
FIG. 10 is a flow chart describing a method for determining errors and their correction according to an embodiment of the present invention.

FIG. 10 is a flow chart 1000 describing a method for determining errors and their correction according to an embodiment of the present invention. In FIG. 10, the syndrome is XORed with each of the possible syndromes corresponding to one error (e.g., the syndromes corresponding to the polynomials 1, x, $x^2$, . . . $x^{22}$ according to the current example) 1010. A determination is made as to whether any of these XORs gives an n-k bit vector, e.g., 11 bit vector in the current example, having zeroes in its first n-k-b bits 1020. If any of these XORs gives an n-k bit vector having zeroes in its first n-k-b bits 1022, then the error pattern corresponds to the last b bits of the syndrome (shifted accordingly), in addition to the random error j corresponding to the power $x^j$ whose XOR with the syndrome renders zero the first n-k-b bits of the XORed vector 1030. Thus, the syndrome and the codes may be used to determine which bits are in error. If none of the XORs renders zero the first n-k-b bits 1024, then the next shift in the decoder is performed 1040.

The decoder 800 and methods 900, 1000 described above is given for illustration purposes only. There are many ways of implementing the determination 930 in FIG. 9, for instance, using a standard circuit for one-error correction. Those skilled in the art can easily adapt the decoding algorithm to make it high speed (as in high-speed error trapping). Decoders can also be adapted for shortened cyclic codes as opposed to cyclic codes like the one shown in the example. Moreover, decoders can also be adapted to correct all-around bursts in the case of shortened codes. The codes presented in the tables 500, 600, 700, even when they are shortened, can correct all-around bursts. However, this may require precomputing the syndromes corresponding to all-around bursts together with a random error, and comparing the initial syndrome to them. Once these syndromes are discarded, the decoding may proceed in the usual way for shortened cyclic codes.

The process illustrated with reference to FIGS. 5–10 may be tangibly embodied in a computer-readable medium or carrier, e.g. one or more of the fixed and/or removable data storage devices 388 illustrated in FIG. 3, or other data storage or data communications devices. The computer program 390 may be loaded into memory 370 to configure the processor 372 for execution of the computer program 390. The computer program 390 include instructions which, when read and executed by a processor 372 of FIG. 3, causes the devices to perform the steps necessary to execute the steps or elements of an embodiment of the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for correcting a burst of errors having a length of b bits together with a random error, comprising:
   providing a received word in a syndrome register for analysis, the syndrome register being defined by a polynomial of degree n-k generating a cyclic code of length n and dimension k, k being the number of information bits in each codeword of said code, the received word being shifted in a first direction in the syndrome register M times, wherein M is less than or equal to n;
   analyzing the syndrome register to determine whether the first n-k-b bits in the syndrome register are zero;
   when a bit in the first n-k-b bits in the syndrome register is determined to be non-zero, XORing the vector in the syndrome register with all possible syndromes corresponding to one error; and
   identifying a random error and an error burst in the last b bits of the syndrome register when an XOR of the first n-k-b bits in the syndrome register results in the first n-k-b bits equaling zero.

2. The method of claim 1, wherein the cyclic code is a shortened cyclic code.

3. The method of claim 1 further comprising when the XORing the syndrome register with all possible syndromes corresponding to one error does not render the first n-k-b bits zero and when the number of shifts of the syndrome register for the received word, M, is less than n, shifting the syndrome register and repeating the analyzing the syndrome register.

4. The method of claim 1, wherein after identifying a random error and an error burst in the last b bits of the syndrome register, correcting the burst and restoring the corrected word by shifting the syndrome register M times in a direction opposite to the first direction.

5. The method of claim 1 further comprising declaring an uncorrectable error when M equals n, when an XOR of the first n-k-b bits in the syndrome register does not result in the first n-k-b bits equaling zero and no correction is effected.

6. The method of claim 1, wherein the error burst length, b, is two.

7. The method of claim 1, wherein the error burst length, b, is three.

8. The method of claim 1 further comprising determining that the last b bits in the register are a burst corresponding to the last b bits of the burst when the first n-k-b bits in the syndrome register are zero.

9. The method of claim 8 further comprising correcting the burst and restoring the corrected word by shifting the syndrome register M times in a direction opposite to the first direction.

10. An apparatus for correcting a burst of errors having a length b together with a random error, comprising:
a trap decoder comprising a syndrome register and a buffer register, the syndrome register defined by a polynomial of degree n-k generating a cyclic code of length n and dimension k, k being the number of information bits in each codeword of said code, the received word being shifted in a first direction in the syndrome register M times, wherein M is less than or equal to n; and
a module, coupled to the syndrome register, for determining, for each shift of the received word, whether a bit in the first n-k-b bits in the syndrome register is non-zero, XORing a vector in the syndrome register with all possible syndromes corresponding to one error and identifying a random error and an error burst in the last b bits of the syndrome register when an XOR of the first n-k-b bits in the syndrome register results in the first n-k-b bits equaling zero.

11. The apparatus of claim 10, wherein the cyclic code is a shortened cyclic code.

12. The apparatus of claim 10, wherein the module is further configured for shifting the syndrome register and repeating the analyzing the syndrome register when the XORing the syndrome register with all possible syndromes corresponding to one error does not render the first n-k-b bits zero and when the number of shifts of the syndrome register for the received word, M, is less than n.

13. The apparatus of claim 10, wherein after the module identifies a random error and an error burst in the last b bits of the syndrome register, the module is further configured for correcting the burst and restoring the corrected word by causing the syndrome register to be shifted M times in a direction opposite to the first direction.

14. The apparatus of claim 10, wherein the module declares an uncorrectable error when M equals n, when an XOR of the first n-k-b bits in the syndrome register does not result in the first n-k-b bits equaling zero and no correction is effected.

15. The apparatus of claim 10, wherein the error burst length, b, is two.

16. The apparatus of claim 10, wherein the error burst length, b, is three.

17. The apparatus of claim 10, wherein the module is further configured for determining that the last b bits in the register are a burst corresponding to the last b bits of the burst when the first n-k-b bits in the syndrome register are zero.

18. The apparatus of claim 17 wherein the module is further configured for correcting the burst and restoring the corrected word by shifting the syndrome register M times in a direction opposite to the first direction.

19. An apparatus for correcting a burst of errors having a length b together with a random error, comprising:
memory for receiving a word representing bits of received data; and
a processor, coupled to the memory, the processor being configured for calculating an n-k bit syndrome for each shift of the received word defined by a polynomial of degree n-k generating a cyclic code of length n and dimension k, k being the number of information bits in each codeword of said code, the received word being shifted in a first direction in the syndrome register M times, wherein M is less than or equal to n, the processor determining, for each shift of the received word, whether a bit in the first n-k-b bits in the syndrome register is non-zero, XORing a vector in the syndrome register with all possible syndromes corresponding to one error and identifying a random error and an error burst in the last b bits of the syndrome register when an XOR of the first n-k-b bits in the syndrome register results in the first n-k-b bits equaling zero.

20. The apparatus of claim 19, wherein the cyclic code is a shortened cyclic code.

21. The apparatus of claim 19, wherein the processor is further configured for shifting the syndrome register and repeating the analyzing the syndrome register when the XORing the syndrome register with all possible syndromes corresponding to one error does not render the first n-k-b bits zero and when the number of shifts of the syndrome register for the received word, M, is less than n.

22. The apparatus of claim 19, wherein after the processor identifies a random error and an error burst in the last b bits of the syndrome register, the processor is further configured for correcting the burst and restoring the corrected word by causing the syndrome register to be shifted M times in a direction opposite to the first direction.

23. The apparatus of claim 19, wherein the processor declares an uncorrectable error when M equals n, when an XOR of the first n-k-b bits in the syndrome register does not result in the first n-k-b bits equaling zero and no correction is effected.

24. The apparatus of claim 19, wherein the error burst length, b, is two.

25. The apparatus of claim 19, wherein the error burst length, b, is three.

26. The apparatus of claim 19, wherein the processor is further configured for determining that the last b bits in the register are a burst corresponding to the last b bits of the burst when the first n-k-b bits in the syndrome register are zero.

27. The apparatus of claim 26 wherein the processor is further configured for correcting the burst and restoring the corrected word by shifting the syndrome register M times in a direction opposite to the first direction.

28. A storage system, comprising:
at least one magnetic recording medium for recording data thereon;
at least one transducer, associated with each of the at least one magnetic recording medium, for reading and writing data on the magnetic recording medium;

a motor, coupled to the at least one magnetic recording medium, for translating the magnetic recording medium;

an actuator, coupled to the transducer, for translating the at least one transducer relative to the at least one magnetic recording medium; and a storage device signal processor, coupled to the motor, transducer and actuator, for controlling the operation of the motor and actuator and for correcting a burst of errors having a length b together with a random error in a word received from the transducer, the storage device signal processor being configured for calculating an n-k bit syndrome for each shift of the received word defined by a polynomial of degree n-k generating a cyclic code of length n and dimension k, k being the number of information bits in each codeword of said code, the received word being shifted in a first direction in the syndrome register M times, wherein M is less than or equal to n, the processor determining, for each shift of the received word, whether a bit in the first n-k-b bits in the syndrome register is non-zero, XORing a vector in the syndrome register with all possible syndromes corresponding to one error and identifying a random error and an error burst in the last b bits of the syndrome register when an XOR of the first n-k-b bits in the syndrome register results in the first n-k-b bits equaling zero.

29. A program storage device readable by a computer, the program storage device tangibly embodying one or more programs of instructions executable by the computer to perform a method for correcting a burst of errors together with a random error using shortened cyclic codes, the method comprising:

providing a received word in a syndrome register for analysis, the syndrome register being defined by a polynomial of degree n-k generating a cyclic or shortened cyclic code of length n and dimension k, k being the number of information bits in each codeword of said code, the received word being shifted in a first direction in the syndrome register M times, wherein M is less than or equal to n;

analyzing the syndrome register to determine whether the first n-k-b bits in the syndrome register are zero;

when a bit in the first n-k-b bits in the syndrome register is determined to be non-zero, XORing the vector in the syndrome register with all possible syndromes corresponding to one error; and identifying a random error and an error burst in the last b bits of the syndrome register when an XOR of the first n-k-b bits in the syndrome register results in the first n-k-b bits equaling zero.

30. An apparatus for correcting a burst of errors having length b together with a random error, comprising:

means for receiving a word representing bits of received data;

means, coupled to the memory, for calculating an n-k bit syndrome for each shift of the received word defined by a polynomial of degree n-k generating a cyclic code of length n and dimension k, k being the number of information bits in each codeword of said code, the received word being shifted in a first direction in the syndrome register M times, wherein M is less than or equal to n;

means for determining for each shift of the received word, whether a bit in the first n-k-b bits in the syndrome register is non-zero;

means for XORing a vector in the syndrome register with all possible syndromes corresponding to one error; and means for identifying a random error and an error burst in the last b bits of the syndrome register when an XOR of the first n-k-b bits in the syndrome register results in the first n-k-b bits equaling zero.

* * * * *